United States Patent
Takeshima et al.

(10) Patent No.: US 12,211,199 B2
(45) Date of Patent: Jan. 28, 2025

(54) METHOD FOR INSPECTING SEMICONDUCTOR AND SEMICONDUCTOR INSPECTING DEVICE

(71) Applicant: HAMAMATSU PHOTONICS K.K., Hamamatsu (JP)

(72) Inventors: Tomochika Takeshima, Hamamatsu (JP); Takafumi Higuchi, Hamamatsu (JP); Kazuhiro Hotta, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 427 days.

(21) Appl. No.: 17/608,857

(22) PCT Filed: Apr. 16, 2020

(86) PCT No.: PCT/JP2020/016753
§ 371 (c)(1),
(2) Date: Nov. 4, 2021

(87) PCT Pub. No.: WO2020/246150
PCT Pub. Date: Dec. 10, 2020

(65) Prior Publication Data
US 2022/0301135 A1  Sep. 22, 2022

(30) Foreign Application Priority Data
Jun. 3, 2019 (JP) .................................. 2019-103831

(51) Int. Cl.
*G06T 7/00* (2017.01)
*G06T 3/4053* (2024.01)
(Continued)

(52) U.S. Cl.
CPC ............ *G06T 7/001* (2013.01); *G06T 3/4053* (2013.01); *G06T 7/30* (2017.01); *G06F 30/392* (2020.01);
(Continued)

(58) Field of Classification Search
CPC ......... G06T 7/001; G06T 3/4053; G06T 7/30; G06T 2207/20081; G06T 2207/20084;
(Continued)

(56) References Cited

U.S. PATENT DOCUMENTS

2008/0298719 A1* 12/2008 Sengupta ................ G06T 7/001
382/294
2017/0148226 A1    5/2017 Zhang et al.
(Continued)

FOREIGN PATENT DOCUMENTS

JP     2009-162718 A     7/2009
JP     2018-195069 A    12/2018
(Continued)

OTHER PUBLICATIONS

International Preliminary Report on Patentability mailed Dec. 16, 2021 for PCT/JP2020/016753.

*Primary Examiner* — Ping Y Hsieh
*Assistant Examiner* — Xiao Liu
(74) *Attorney, Agent, or Firm* — Faegre Drinker Biddle & Reath LLP (57) ABSTRACT

A semiconductor inspection method by an observation system includes a step of acquiring a first pattern image showing a pattern of a semiconductor device, a step of acquiring a second pattern image showing a pattern of the semiconductor device and having a different resolution from a resolution of the first pattern image, a step of learning a reconstruction process of the second pattern image using the first pattern image as training data by machine learning, and reconstructing the second pattern image into a reconstructed image having a different resolution from a resolution of the second pattern image by the reconstruction process based on a result of the learning, and a step of performing alignment based on a region calculated to have a high degree of
(Continued)

certainty by the reconstruction process in the reconstructed image and the first pattern image.

14 Claims, 5 Drawing Sheets

(51) Int. Cl.
*G06T 7/30* (2017.01)
*G06F 30/392* (2020.01)

(52) U.S. Cl.
CPC ............. *G06T 2207/20081* (2013.01); *G06T 2207/20084* (2013.01); *G06T 2207/30148* (2013.01)

(58) Field of Classification Search
CPC ........ G06T 2207/30148; G06F 30/392; G06N 3/045; G06N 3/08; G06N 3/04
See application file for complete search history.

(56) References Cited

U.S. PATENT DOCUMENTS

| | | |
|---|---|---|
| 2017/0177997 A1 | 6/2017 | Karlinsky et al. |
| 2017/0193680 A1* | 7/2017 | Zhang ................. G06V 30/2504 |
| 2017/0345140 A1 | 11/2017 | Zhang et al. |
| 2018/0293346 A1 | 10/2018 | Cilingiroglu et al. |
| 2018/0330511 A1* | 11/2018 | Ha .......................... G06F 30/00 |
| 2018/0350062 A1 | 12/2018 | Adato et al. |
| 2019/0228522 A1* | 7/2019 | Shinoda ................... G06T 7/001 |

FOREIGN PATENT DOCUMENTS

| | | |
|---|---|---|
| JP | 2019-129169 A | 8/2019 |
| TW | 201837458 A | 10/2018 |
| WO | WO-2015/098342 A1 | 7/2015 |

\* cited by examiner

METHOD FOR INSPECTING SEMICONDUCTOR AND SEMICONDUCTOR INSPECTING DEVICE

TECHNICAL FIELD

The present disclosure relates to a semiconductor inspection method and a semiconductor inspection device for inspecting a semiconductor device.

BACKGROUND ART

Conventionally, an image has been acquired by using a semiconductor device as an inspection target device (DUT: device under test), and various analyses such as identification of a faulty part have been performed based on the image (see Patent Literature 1 below and Patent Literature 2 below). For example, Patent Literature 1 below discloses that resolution of an optical image such as an LSM image is increased to generate a reconstructed image, and the reconstructed image is aligned with respect to a CAD image. According to such a method, accurate alignment of optical images becomes possible.

CITATION LIST

Patent Literature

Patent Literature 1: U.S. Patent No. 2018/0293346
Patent Literature 1: International Publication WO 2015/098342

SUMMARY OF INVENTION

Technical Problem

In the conventional alignment method described above, the tendency of the pattern appearing in the optical image may not match the tendency of the pattern in the CAD image. For this reason, the accuracy of alignment using a pattern image showing a pattern of a semiconductor device may not be sufficiently improved in some cases.

An embodiment has been made in view of such a problem, and an object of the embodiment is to provide a semiconductor inspection method capable of accurately performing alignment based on a pattern image acquired for a semiconductor device.

Solution to Problem

A semiconductor inspection method according to an aspect of the present disclosure includes a step of acquiring a first pattern image showing a pattern of a semiconductor device, a step of acquiring a second pattern image showing a pattern of the semiconductor device and having a different resolution from a resolution of the first pattern image, a step of learning a reconstruction process of the second pattern image using the first pattern image as training data by machine learning, and reconstructing the second pattern image into a reconstructed image having a different resolution from a resolution of the second pattern image by the reconstruction process based on a result of the learning, and a step of performing alignment based on a region calculated to have a high degree of certainty by the reconstruction process in the reconstructed image and the first pattern image.

Alternatively, a semiconductor inspection device according to another aspect of the present disclosure includes an acquisition unit configured to acquire a first pattern image showing a pattern of a semiconductor device and a second pattern image showing a pattern of the semiconductor device and having a different resolution from a resolution of the first pattern image, an image conversion unit configured to learn a reconstruction process of the second pattern image using the first pattern image as training data by machine learning, and reconstruct the second pattern image into a reconstructed image having a different resolution from a resolution of the second pattern image by the reconstruction process based on a result of the learning, and an alignment unit configured to perform alignment based on a region calculated to have a high degree of certainty by the reconstruction process in the reconstructed image and the first pattern image.

According to the aspect or the other aspect, the first pattern image and the second pattern image showing patterns of the semiconductor device and having different resolutions are acquired, the second pattern image is converted into a reconstructed image resembling the resolution of the first pattern image by the reconstruction process based on a learning result by machine learning, and alignment is performed based on a region of the reconstructed image having a high degree of certainty and the first pattern image. In this way, when alignment is performed for two pattern images having different pattern tendencies, the accuracy of alignment can be improved.

Advantageous Effects of Invention

According to the embodiment, it is possible to accurately perform alignment based on a pattern image acquired for a semiconductor device.

DESCRIPTION OF EMBODIMENTS

Hereinafter, an embodiment of the present disclosure will be described in detail with reference to the accompanying drawings. Note that in the description, the same reference symbols will be used for the same elements or elements having the same function, and duplicate description will be omitted.

Figure 1:
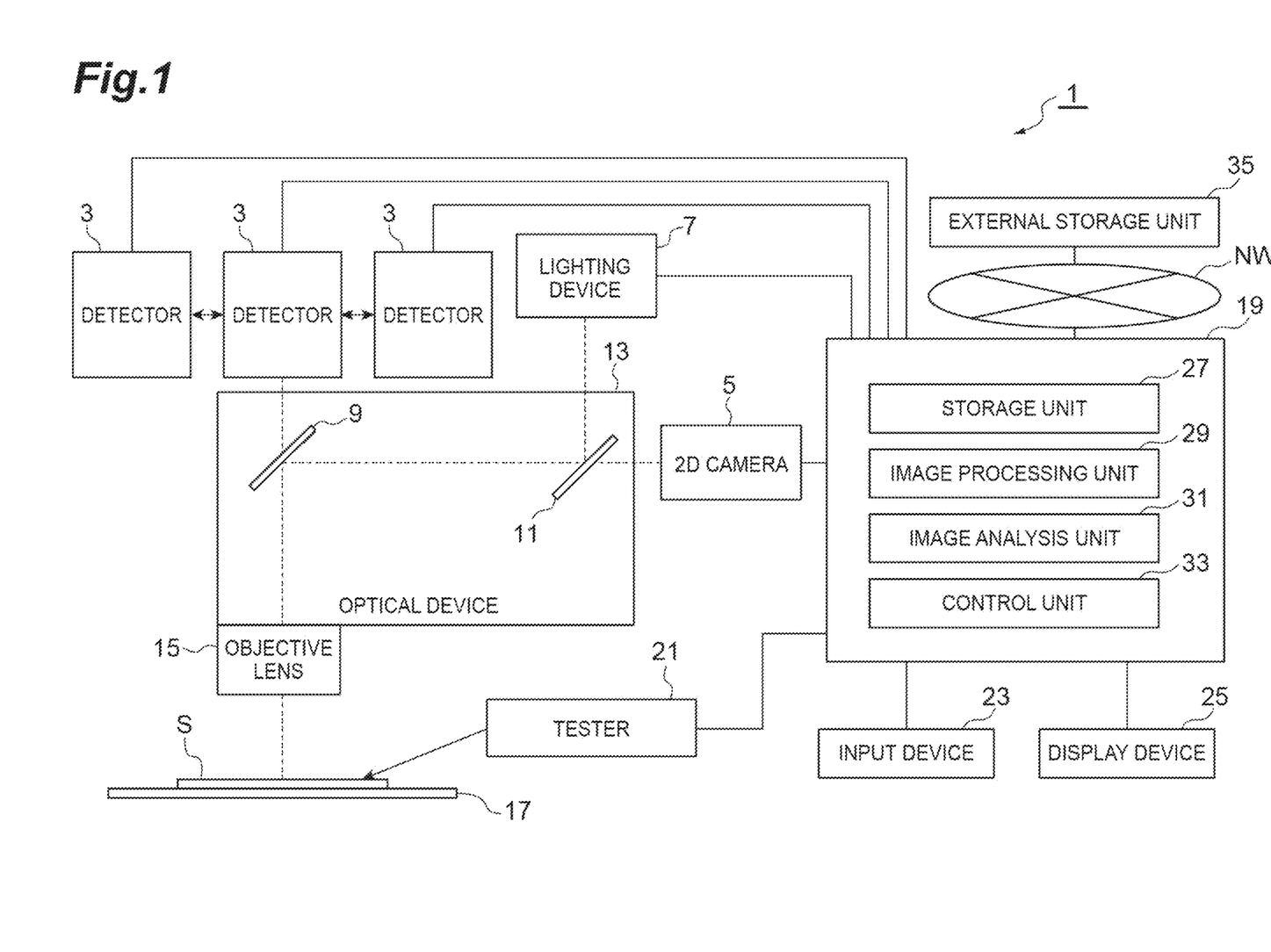
FIG. 1 is a schematic configuration diagram of an observation system 1 according to an embodiment.

FIG. 1 is a schematic configuration diagram of an observation system 1 which is a semiconductor inspection device according to the present embodiment. The observation system 1 illustrated in FIG. 1 is an optical system that acquires and processes an image such as a heat generation image of a semiconductor device such as a logic LSI, an integrated circuit (IC) such as a memory, or a power device to inspect the semiconductor device. The observation system 1 includes a plurality of detectors 3, a two-dimensional (2D) camera 5, a lighting device 7, an optical device (optical system) 13 incorporating a dichroic mirror 9 and a beam splitter 11 such as a half mirror, an objective lens 15, a stage 17, a computer (personal computer) 19, a tester 21, an input device 23, and a display device 25.

Each of the plurality of detectors 3 is a photodetector that detects (measures) light from a semiconductor device S placed on the stage 17. For example, the detector 3 may be an imaging device such as an indium gallium arsenide (InGaAs) camera or an indium antimonide (InSb) camera having sensitivity to infrared wavelengths. Further, the detector 3 may be a detection system that detects reflected light while two-dimensionally scanning laser light on the semiconductor device S, thereby outputting a detection signal for acquiring a laser scanning microscope (LSM) image or an electro optical frequency mapping (EOFM) image. Each of the plurality of detectors 3 is switched so as to be optically connectable to the optical device 13, and detects light from the semiconductor device S via the objective lens 15 and the dichroic mirror 9 in the optical device 13.

The 2D camera 5 is a camera incorporating a charge coupled device (CCD) image sensor, a complementary metal-oxide semiconductor (CMOS) image sensor, etc., and a photodetector that detects (measures) reflected light from the semiconductor device S placed on the stage 17 and outputs a detection signal for a 2D pattern image of the semiconductor device. The 2D camera 5 detects the 2D pattern image of the semiconductor device S via the objective lens 15, and the dichroic mirror 9 and the beam splitter 11 in the optical device 13.

The objective lens 15 is provided so as to face the semiconductor device S, and sets the magnification of an image formed on the plurality of detectors 3 and the 2D camera 5. The objective lens 15 includes a plurality of built-in lenses having different magnifications, and has a function of switching the built-in lens forming images on the detectors 3 or the 2D camera 5 between a high-magnification lens and a low-magnification lens.

The dichroic mirror 9 transmits light in a predetermined wavelength range in order to guide an image such as a light emission image, a heat generation image, or a reflection image of the semiconductor device S to the detector 3, and reflects light having a wavelength other than the predetermined wavelength range in order to guide the 2D pattern image of the semiconductor device S to the 2D camera 5. The beam splitter 11 transmits the pattern image reflected by the dichroic mirror 9 toward the 2D camera 5, and reflects illumination light for generating the 2D pattern image emitted from the lighting device 7 toward the dichroic mirror 9, thereby irradiating the semiconductor device S with the illumination light via the dichroic mirror 9 and the objective lens 15.

The tester 21 applies a predetermined electric signal test pattern, a predetermined voltage, or a predetermined current to the semiconductor device S. By applying this test pattern, light emission or heat generation due to a failure of the semiconductor device S occurs.

The computer 19 is an image processing device that processes the detection signal acquired by the detectors 3 and the 2D camera 5. Specifically, the computer 19 includes a storage unit 27, an image processing unit (acquisition unit) 29, an image analysis unit (image conversion unit and alignment unit) 31, and a control unit 33 as functional components. Further, the computer 19 is provided with the input device 23 such as a mouse or keyboard for inputting data to the computer 19, and the display device 25 such as a display for displaying an image processing result by the computer 19.

Each functional unit of the computer 19 illustrated in FIG. 1 is a function implemented by an arithmetic processing device (processor) such as a CPU of the computer 19 executing a computer program (image processing program) stored in a storage medium such as an internal memory of the computer 19 or a hard disk drive. The arithmetic processing device of the computer 19 causes the computer 19 to function as each functional unit of FIG. 1 by executing this computer program, and sequentially executes a semiconductor inspection process described later. Various data necessary for executing the computer program and various data generated by executing the computer program are all stored in the internal memory such as ROM or RANI of the computer 19 or a storage medium such as a hard disk drive.

Here, a function of each functional unit of the computer 19 will be described.

The storage unit 27 stores a measurement image acquired by the detector 3, in which a light emission image or a heat generation image, etc. is detected, an optical image which is pattern image showing a pattern of the semiconductor device S acquired by the detector 3 or the 2D camera 5, and a CAD image which is a pattern image showing a high-resolution pattern of the semiconductor device S created based on CAD data acquired from the outside. The optical image is an image showing an optical measurement result of a 2D pattern of the semiconductor device S, and may be an image of a 2D pattern detected by the 2D camera 5 or the detector 3, or an LSM image based on a detection signal detected by the detector 3. The image processing unit 29 sequentially generates the measurement image and the optical image based on the detection signal received from the detectors 3 or the 2D camera 5, and sequentially stores the measurement image and the optical image in the storage unit 27. Further, the image processing unit 29 receives input of CAD data from an external storage unit 35 constructed in an external PC, a server device, etc. via a network NW, generates a CAD image from the CAD data, and causes the storage unit 27 to store the generated CAD image. This CAD data is generated by software referred to as a layout viewer stored in an external PC, a server device, etc. based on design information related to layout of respective layers such as a diffusion layer, a metal layer, a gate layer, and an element separation layer of the semiconductor device S. This CAD data is used as the first CAD image showing the pattern image of the semiconductor device S.

The control unit 33 controls data processing in the computer 19 and processing of a device connected to the computer 19. Specifically, the control unit 33 controls emission of illumination light by the lighting device 7, imaging by the plurality of detectors 3 and the 2D camera 5, switching connection of the plurality of detectors 3 to the optical device 13, switching the magnification of the objective lens 15, application of test pattern by the tester 21, display of an observation result by the display device 25, etc.

The image analysis unit 31 performs a reconstruction process and an alignment process on various images sequentially stored in the storage unit 27. Details of a function of each process of the image analysis unit 31 will be described below.

The image analysis unit 31 generates a reconstructed image resembling a resolution of one pattern image (referred to as a first pattern image) based on the other pattern image (referred to as a second pattern image) described in the storage unit 27 (reconstruction process). That is, the image analysis unit 31 reconstructs the second pattern image into a reconstructed image having a different resolution. These first pattern image and second pattern image are images showing patterns in the same range on a surface of the same semiconductor device S and having mutually different resolutions. The resolution of the first pattern image may be higher or lower than the resolution of the second pattern image as long as the resolution of the first pattern image is different from the resolution of the second pattern image. However, in terms of improving the accuracy of an alignment process described later, it is preferable that the resolution of the first pattern image is higher than the resolution of the second pattern image. For example, the first pattern image is a CAD image, and the second pattern image is an image having a lower resolution than that of the CAD image, and is an LSM image, an image captured by the InGaAs camera, an image captured by the InSb camera, or an image acquired by the 2D camera 5. Further, the first pattern image is an LSM image, and the second pattern image is an image having a lower resolution than that of the LSM image, and is an image captured by the InGaAs camera, an image captured by the InSb camera, or an image acquired by the 2D camera 5.

The reconstruction process by the image analysis unit 31 is executed using a learning model obtained as a result of pre-learning by deep learning, which is a type of machine learning, by setting a plurality of second pattern images acquired in advance as training data, and a first pattern image corresponding to the second pattern image as training data. Data of the learning model obtained by the pre-learning is stored in the storage unit 27 and is referred to during a subsequent reconstruction process. For example, as the learning model for deep learning, convolutional neural network (CNN), fully convolutional networks (FCN), U-Net, residual network (ResNet), etc. are used. However, the learning model is not limited to a specific one, and the number of nodes and the number of layers in the learning model can be arbitrarily set.

Figure 2:
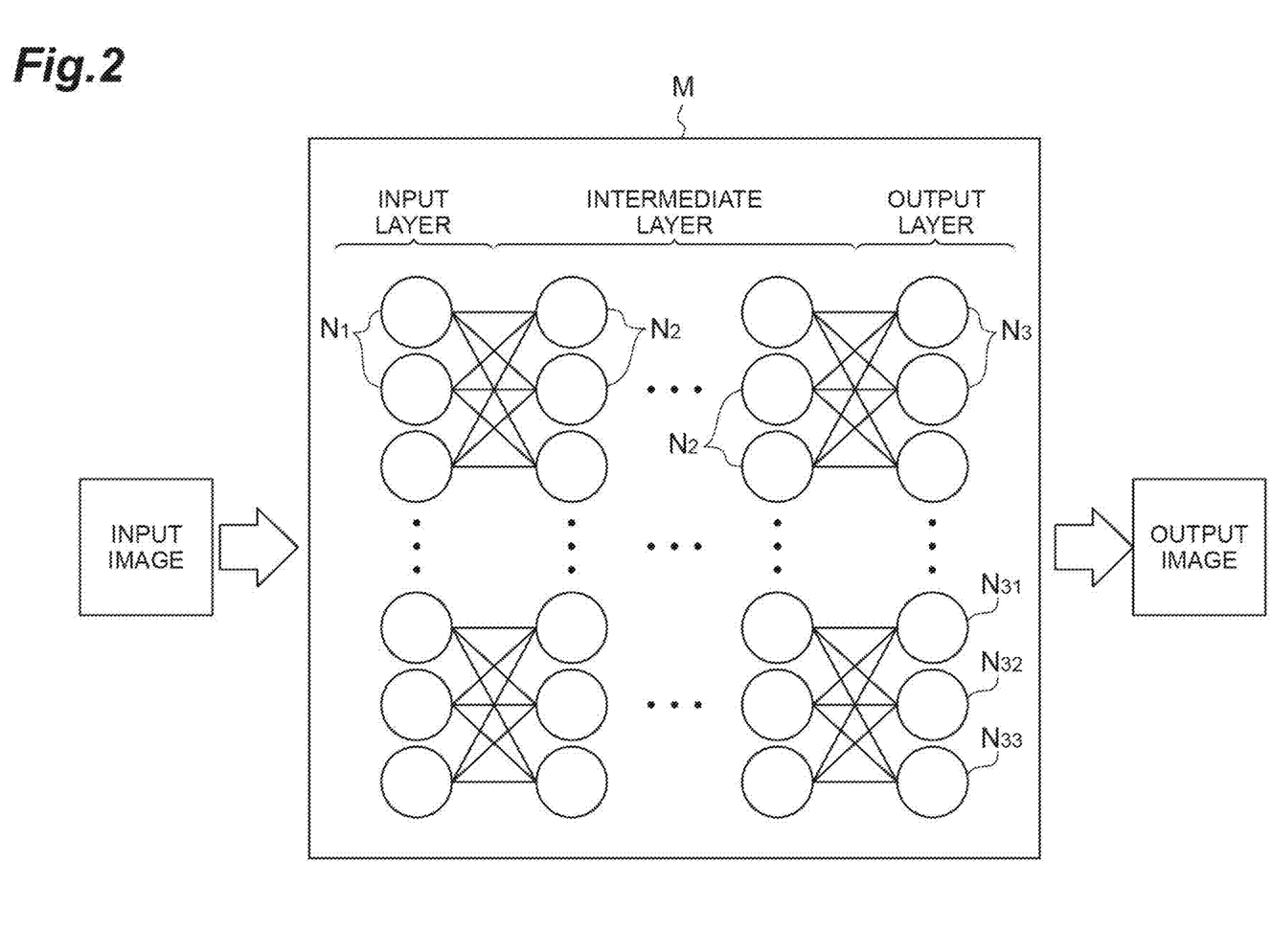
FIG. 2 is a diagram illustrating a configuration of a learning model of a reconstruction process by a computer 19 of FIG. 1.

FIG. 2 illustrates a configuration of a learning model of a neural network for modeling the reconstruction process by pre-learning. As described above, a learning model M of the reconstruction process includes an input layer, an intermediate layer, and an output layer, and a value can be propagated from a plurality of nodes $N_1$ in the input layer to a plurality of nodes $N_3$ in the output layer via a plurality of nodes $N_2$ in the intermediate layer. A pixel value of each pixel in an input image is input to each node $N_1$ in the input layer, and a value is allocated to each pixel in an output image from the plurality of nodes $N_3$ in the output layer. In the pre-learning, an activation function, a weight parameter, a bias parameter, etc. used to calculate an output value of each node when a value propagates among the respective nodes $N_1$, $N_2$, and $N_3$ are learned by solving an optimization problem. Further, in the learning model M, each node $N_3$ in the output layer is labeled (for example, to indicate whether each pixel is a gate, a diffusion layer, a metal, or an element separation layer), and a value propagated to each node $N_3$ is calculated as a degree of certainty of the labeled node $N_3$. For example, as the activation function of the output layer, a function with an output value of 0 to 1 such as sigmoid or softmax or a function normalized with an output value in a range of 0 to 1 is used, and the output value is acquired as a degree of certainty.

In the reconstruction process using the above-mentioned learning model in which the second pattern image is set as the input image, the image analysis unit 31 allocates a pixel value output from the node $N_3$ in the output layer to each pixel of the reconstructed image as the output image, and acquires a degree of certainty indicating reliability of the reconstruction process related to the pixel value. In this instance, a value finally allocated to each pixel of the reconstructed image may be a value corresponding to a label having a highest degree of certainty, or may be a value of the degree of certainty of the pixel. For example, the case is assumed in which the nodes $N_{31}$, $N_{32}$, and $N_{33}$ of the output layer of FIG. 2 are allocated to a specific pixel of the reconstructed image, and a learning model M in which each of the nodes is labeled as one of "gate", "diffusion layer", "element separation layer", and "metal" is used. When "0.7", "0.2", and "0.1" are acquired as degrees of certainty of the nodes $N_{31}$, $N_{32}$, and $N_{33}$ as a result of executing the reconstruction process on the second pattern image using such a learning model M, the image analysis unit 31 may acquire a pixel value of a specific pixel of the reconstructed image as a highest degree of certainty "0.7", or as a value corresponding to the label "gate" of the node $N_{31}$ having the highest degree of certainty. Further, the node $N_{31}$ having a high degree of certainty may be allocated to the diffusion layer considered to form the optical contrast in an advanced device, or conversely, the element separation layer.

Figure 3:
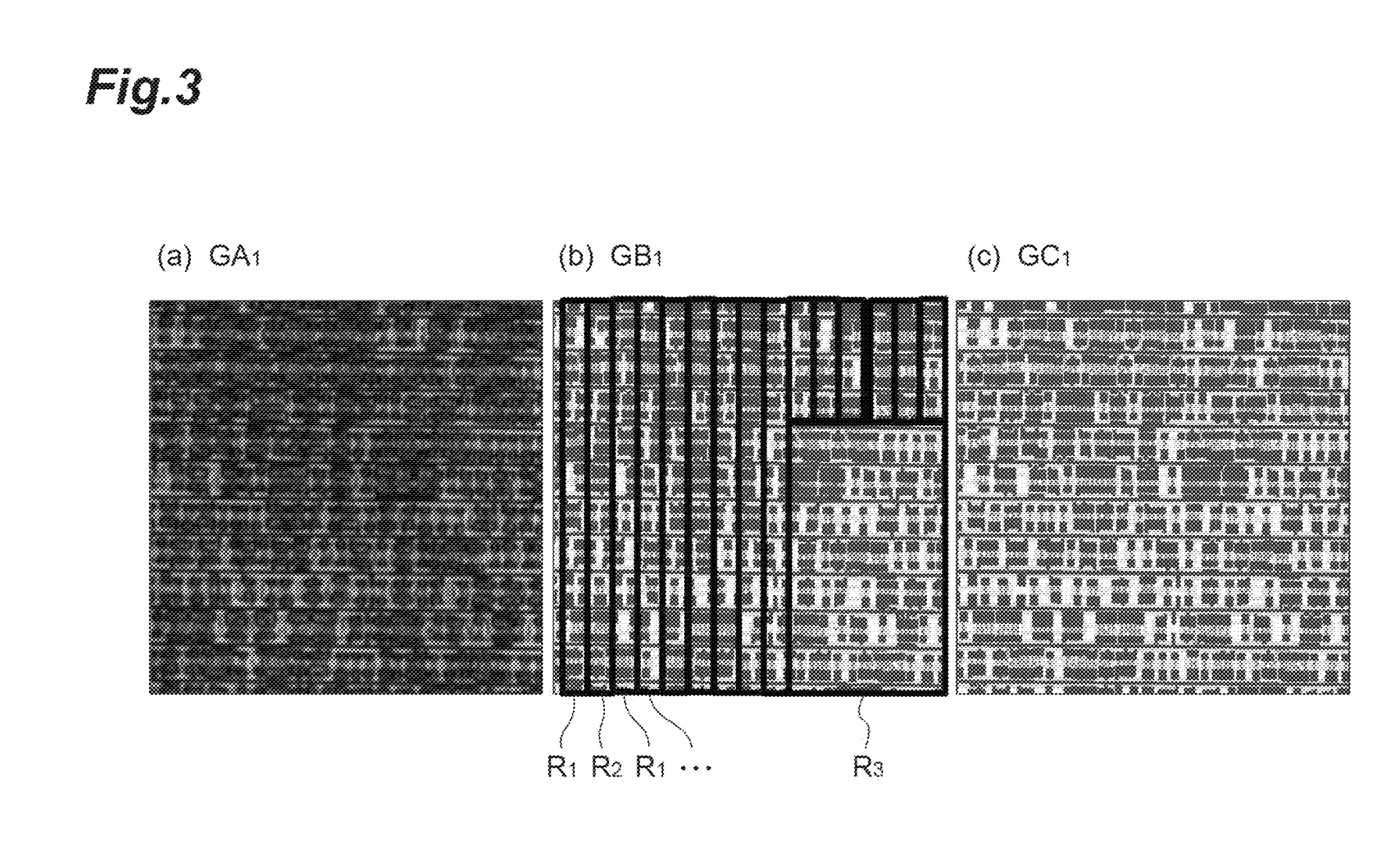
FIG. 3(a) is a diagram illustrating an example of a second pattern image which is a target of a reconstruction process.
FIG. 3(b) is a diagram illustrating an example of a reconstructed image generated by the reconstruction process targeting the second pattern image of FIG. 3(a)
FIG. 3(c) is a diagram illustrating an example of a CAD image which is a first pattern image of FIG. 3(a).

FIG. 3 illustrates an example of an image processed by the image analysis unit 31. FIG. 3(*a*) illustrates an LSM image $GA_1$, which is a second pattern image targeted for the reconstruction process, FIG. 3(*b*) illustrates a reconstructed image $GB_1$ generated by the reconstruction process targeting the LSM image $GA_1$ of FIG. 3(A), and FIG. 3(*c*) illustrates a CAD image $GC_1$ which is a first pattern image corresponding to the second pattern image of FIG. 3(*a*), respectively. In this way, a low-resolution and unclear part of the LSM image $GA_1$ is converted by the reconstruction process so as to be closer to the CAD image $GC_1$, and the reconstructed image $GB_1$ resembling the resolution of the CAD image $GC_1$ as a whole is generated. Furthermore, in the reconstructed image $GB_1$ generated by the image analysis unit 31, each pixel is classified as a level using a degree certainty acquired for each pixel. For example, the reconstructed image $GB_1$ is classified by the image analysis unit 31 into regions $R_1$, $R_2$, and $R_3$ having levels of three degrees of certainty in descending order of the degree of certainty using threshold values.

Furthermore, the image analysis unit 31 executes alignment related to mutual image positions by applying pattern matching based on the reconstructed image $GB_1$ generated by the reconstruction process described above and the first pattern image corresponding to the range of the second pattern image on the semiconductor device S which is a basis of the reconstruction image. In this instance, the image analysis unit 31 preferentially uses a region of the reconstructed image $GB_1$ classified as a level having a high degree of certainty to perform the alignment. For example, alignment may be performed using the region $R_1$ of the reconstructed image $GB_1$ classified as having the highest degree of certainty, or alignment may be performed using the reconstructed image $GB_1$ by weighting each of the regions $R_1$, $R_2$, and $R_3$ according to the level of the degree of certainty. Then, the image analysis unit 31 uses a result of the alignment to superimpose a measurement image in which a heat generation image, etc. is detected by measuring the same range as that of the LSM image $GA_1$, which is the second pattern image, and the CAD image $GC_1$ which is the first pattern image, and causes the display device 25 to display the images.

Figure 4:
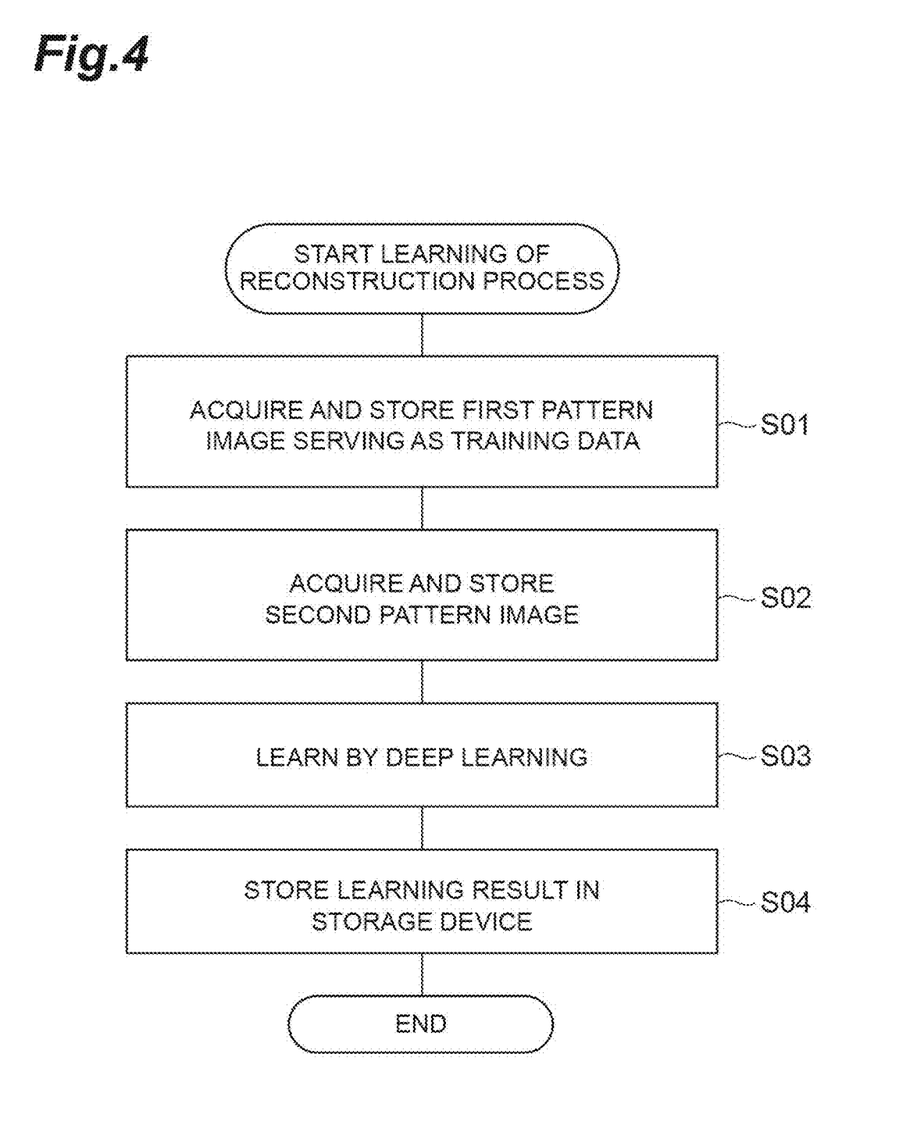
FIG. 4 is a flowchart illustrating a flow of a process of pre-learning for generating a learning model of the a reconstruction process by the observation system 1.
Figure 5:
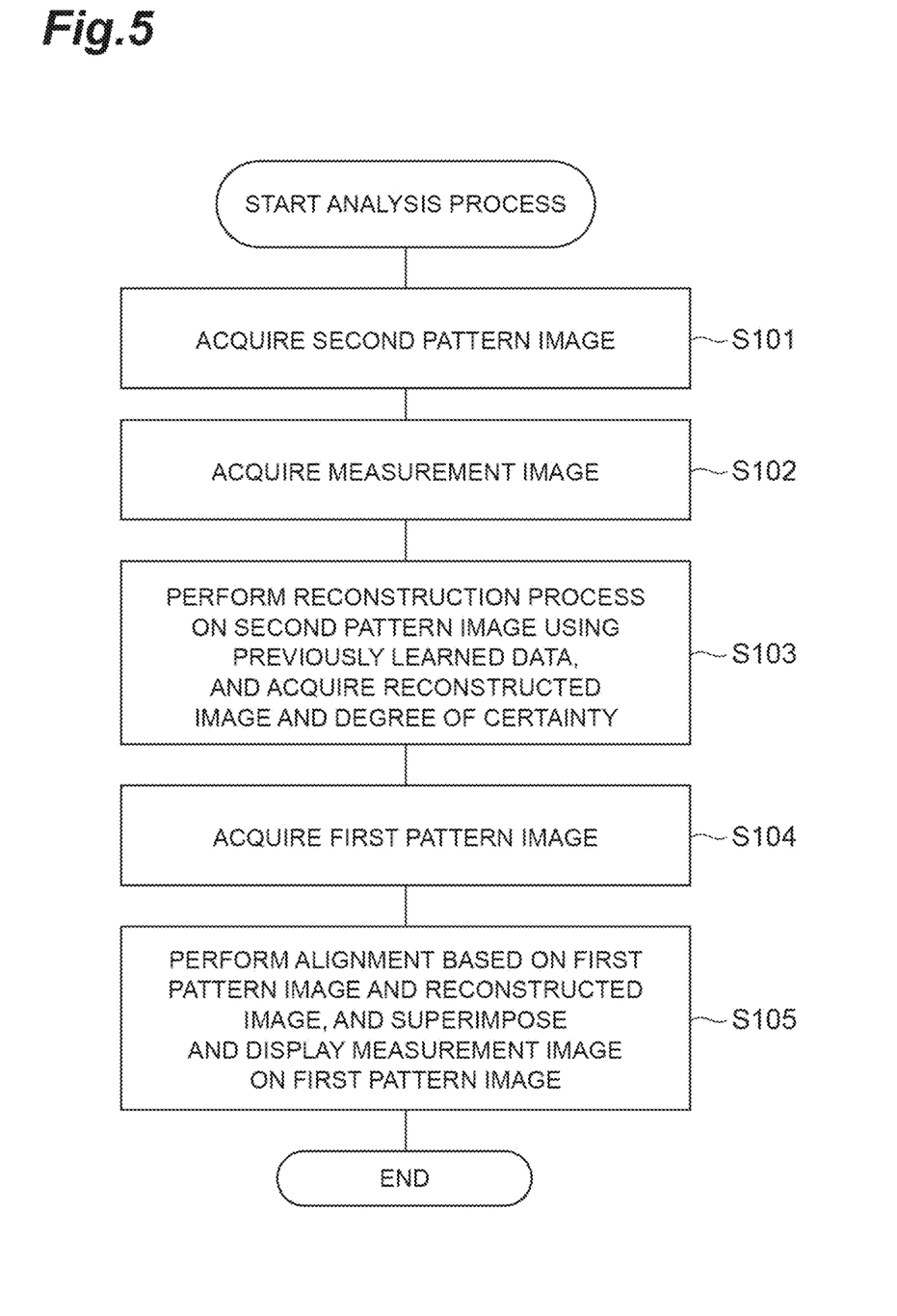
FIG. 5 is a flowchart illustrating a flow of an analysis process of a semiconductor device S by the observation system 1.

Next, a procedure for processing the semiconductor inspection method executed by the observation system 1 will be described with reference to FIGS. 4 and 5. FIG. 4 is a flowchart illustrating a flow of processing of pre-learning for generating a learning model of the reconstruction process, and FIG. 5 is a flowchart illustrating a flow of analysis processing of the semiconductor device S.

First, referring to FIG. 4, when the computer 19 starts learning of the reconstruction process at an arbitrary timing such as a user operation, etc., the computer 19 acquires a plurality of pieces of CAD data from the outside, acquires a CAD image serving as training data as a first pattern image based on the CAD data, and stores the acquired CAD image in the storage unit 27 (step S01). Alternatively, in step S01, a plurality of optical images (for example, LSM images) of the semiconductor device S may be acquired as the first pattern image by controlling the detector 3, the 2D camera 5, the lighting device 7, etc. Next, when the detector 3, the 2D camera 5, the lighting device 7, etc. are controlled by the computer 19, a plurality of second pattern images, which are training data, are acquired and stored in the storage unit 27 (step S02).

Thereafter, for a plurality of combinations of the first pattern image and the second pattern image stored in the storage unit 27, the image analysis unit 31 of the computer 19 constructs a learning model of the reconstruction process by deep learning (step S03). As a result, data of the learning model acquired by the image analysis unit 31 is stored in the storage unit 27 (step S04).

A description will be given of a procedure of analysis processing of the semiconductor device S after construction of the learning model of the reconstruction process with reference to FIG. 5. First, when the detector 3, the 2D camera 5, the lighting device 7, etc. are controlled by the computer 19, the second pattern image and the measurement image targeting the semiconductor device S are acquired and stored in the storage unit 27 (step S101, step S102).

Subsequently, when the image analysis unit 31 of the computer 19 refers to the data of the learning model stored in the storage unit 27 and performs the reconstruction process on the second pattern image, a reconstructed image and a degree of certainty corresponding to each pixel of the reconstructed image are acquired (step S103). Thereafter, the image processing unit 29 acquires a first pattern image showing a pattern in the same range on the semiconductor device S as that of the second pattern image, and stores the first pattern image in the storage unit 27 (step S104). Then, the image analysis unit 31 weights the reconstructed image according to the degree of certainty, so that the reconstructed image and the first pattern image are aligned. Finally, the image analysis unit 31 superimposes the measurement image on the first pattern image and displays the images on the display device 25 using an alignment result (step S105).

According to the observation system 1 according to the present embodiment described above, a first pattern image and a second pattern image showing patterns of the semiconductor device S and having different resolutions are acquired, the second pattern image is converted into a reconstructed image resembling the resolution of the first pattern image by the reconstruction process based on a learning result by machine learning, and alignment with the first pattern image is performed by preferentially using a region of the reconstructed image having a high degree of certainty of the reconstructed process. In this way, when alignment is performed for two pattern images having different tendencies in pattern resolution, etc., the accuracy of alignment can be improved. In particular, by executing the reconstruction process constructed as a result of pre-learning by deep learning, the second pattern image can be effectively converted so as to be closer to the resolution of the first pattern image. Further, alignment is performed preferentially using a region having a high degree of certainty in the reconstructed image acquired by the reconstruction process. As a result, the accuracy of alignment between the first pattern image and the second pattern image can be effectively improved.

Further, in the present embodiment, when aligning the first pattern image and the reconstructed image, a degree of certainty based on an output value of a node of the output layer in the learning model of the reconstructed process is used. In this way, alignment is performed based on a region predicted to be close to the first pattern image in the reconstructed image, so that the accuracy of the alignment can be improved more effectively.

Even though various embodiments of the present disclosure have been described above, the present disclosure is not limited to the above embodiments, and may be modified or applied to another one without changing the gist described in each claim.

For example, the image analysis unit 31 of the embodiment superimposes and displays the measurement image and the first pattern image using the alignment result. However, only the first pattern image or data which is a basis of the first pattern image may be displayed. In this case, the computer 19 may have a function of setting an analysis position for irradiating light based on a result of alignment on the displayed first pattern image or data which is a basis of the first pattern image. Further, the computer 19 may have a function of superimposing and displaying a signal such as a light emission signal detected from the semiconductor device S on the first pattern image or the data which is a basis of the first pattern image based on an alignment result. By displaying an image having a high resolution in this way, the user can easily recognize the position.

Note that a degree of coincidence used for weighting in the embodiment can be used for displaying an image or a waveform reconstructed by deep learning. For example, in the observation system illustrated in FIG. 1, it is possible to irradiate a DUT with light and observe a waveform inside the DUT from information contained in reflected light. This waveform can be observed as a good waveform having a high SN ratio when the number of times of integration is large. However, an analysis time becomes longer according to the number of times of integration. Therefore, in order to display a waveform having good visibility with a small number of times of integration, waveform reconstruction by deep learning is applied. As a result, it is possible to convert a waveform with a small number of times of integration into a waveform having a high SN ratio. In this instance, since a degree of certainty can be calculated for each time zone of the waveform, a result is output according to the waveform. This degree of certainty is superimposed on the waveform and displayed. It is possible to adopt various display methods such as changing a color of a line indicating a waveform for each time zone, or displaying a time zone in different colors. In this way, when a waveform is analyzed, a time zone to which the waveform corresponds becomes clear. When a degree of certainty of a waveform in a time zone to be focused in waveform analysis is high, the waveform is adopted as an analysis result. On the contrary, when the degree of certainty is not significantly high in the time zone, it is possible to present an analyst with criteria for proceeding with the analysis such as increasing the number of times of integration and acquiring a waveform again.

In the embodiment, the machine learning may be deep learning. In this case, even when targeting pattern images having different pattern tendencies, it is possible to effectively convert one pattern image so as to be closer to a resolution of the other pattern image. As a result, the accuracy of alignment can be further improved.

Further, a degree of certainty may be based on an output value of a node of the output layer in the learning model of the reconstruction process. In this case, alignment is performed based on a region predicted to be close to the first pattern image in the reconstructed image, and the accuracy of the alignment can be reliably improved.

Furthermore, the reconstructed image may be weighted according to a degree of certainty, and then the reconstructed image and the first pattern image may be aligned. In this way, the region of the reconstructed image predicted to be close to the first pattern image is weighted and then aligned, so that the accuracy of the alignment can be reliably improved.

Here, the first pattern image or the second pattern image may be acquired by measuring the semiconductor device, or the first pattern image or the second pattern image may be acquired based on the CAD data related to the semiconductor device.

INDUSTRIAL APPLICABILITY

In the embodiment, the semiconductor inspection method and the semiconductor inspection device for inspecting the semiconductor device are used, and it is possible to accurately perform alignment based on the pattern image acquired for the semiconductor device.

REFERENCE SIGNS LIST

1: observation system, 3: detector, 5: 2D camera, 19: computer, 29: image processing unit (acquisition unit), 31: image analysis unit (image conversion unit, alignment unit), S: semiconductor device.

The invention claimed is:

1. A semiconductor inspection method comprising:
acquiring a second pattern image showing a pattern of a semiconductor device and having a different resolution from a resolution of a first pattern image showing a pattern of the semiconductor device;
reconstructing the second pattern image into a reconstructed image having a different resolution from a resolution of the second pattern image, by a reconstruction process using a learning model acquired by machine learning using training data of a pair of pattern images of the same semiconductor device having resolutions different from each other, wherein the reconstruction process generates an output value of the learning model for each pixel of the reconstructed image, and the reconstructed image is classified into a plurality of regions, each of the plurality of regions having a degree of certainty acquired based on the output value for each pixel within the each of the plurality of regions;
a step of acquiring the first pattern image; and
performing alignment based on a region selected from the plurality of regions in the reconstructed image and the first pattern image, the region having a relatively higher degree of certainty among the plurality of regions.

2. The semiconductor inspection method according to claim 1, wherein the machine learning is deep learning.

3. The semiconductor inspection method according to claim 2, wherein the degree of certainty is based on an output value of a node of an output layer in the learning model.

4. The semiconductor inspection method according to claim 1, wherein the reconstructed image is weighted according to the degree of certainty, and then the reconstructed image and the first pattern image are aligned.

5. The semiconductor inspection method according to claim 1, wherein the first pattern image or the second pattern image is acquired by measuring the semiconductor device.

6. The semiconductor inspection method according to claim 1, wherein the first pattern image or the second pattern image is acquired based on CAD data related to the semiconductor device.

7. The semiconductor inspection method according to claim 1, wherein the learning model is a network connecting an input node for inputting a pixel value of each pixel in the second pattern image and an output node for outputting a pixel value of each pixel in the reconstructed image, and
the degree of certainty is a value propagated to each output node.

8. A semiconductor inspection device comprising:
a circuitry configured to
acquire a first pattern image showing a pattern of a semiconductor device and a second pattern image showing a pattern of the semiconductor device and having a different resolution from a resolution of the first pattern image,
reconstruct the second pattern image into a reconstructed image having a different resolution from a resolution of the second pattern image, by a reconstruction process using a learning model acquired by machine learning using training data of a pair of pattern images of the same semiconductor device having resolutions different from each other, wherein the reconstruction process generates an output value of the learning model for each pixel of the reconstructed image, and the reconstructed image is classified into a plurality of regions, each of the plurality of regions having a degree of certainty acquired based on the output value for each pixel within the each of the plurality of regions, and
perform alignment based on a region selected from the plurality of regions in the reconstructed image and the first pattern image, the region having a relatively higher degree of certainty among the plurality of regions.

9. The semiconductor inspection device according to claim 8, wherein the machine learning is deep learning.

10. The semiconductor inspection device according to claim 9, wherein the degree of certainty is based on an output value of a node of an output layer in the learning model.

11. The semiconductor inspection device according to claim 8, wherein the circuitry weights the reconstructed image according to the degree of certainty, and then aligns the reconstructed image and the first pattern image.

12. The semiconductor inspection device according to claim 8, wherein the circuitry acquires the first pattern image or the second pattern image by measuring the semiconductor device.

13. The semiconductor inspection device according to claim 8, wherein the circuitry acquires the first pattern image or the second pattern image based on CAD data related to the semiconductor device.

14. The semiconductor inspection device according to claim 8, wherein the learning model is a network connecting an input node for inputting a pixel value of each pixel in the second pattern image and an output node for outputting a pixel value of each pixel in the reconstructed image, and the degree of certainty is a value propagated to each output node.

* * * * *